US00RE51081E

(19) United States
(12) Reissued Patent
Feng

(10) Patent Number: US RE51,081 E
(45) Date of Reissued Patent: Oct. 20, 2026

(54) BARK CONTROL DEVICE

(71) Applicant: Shenzhen Zhichong Technology Co., Ltd., Shenzhen (CN)

(72) Inventor: Wenjin Feng, Shenzhen (CN)

(73) Assignee: SHENZHEN ZHICHONG TECHNOLOGY CO., LTD., Shenzhen (CN)

(21) Appl. No.: 19/262,121

(22) Filed: Jul. 8, 2025

Related U.S. Patent Documents

Reissue of:
(64) Patent No.: 12,150,430
Issued: Nov. 26, 2024
Appl. No.: 18/398,618
Filed: Dec. 28, 2023

(30) Foreign Application Priority Data

Dec. 15, 2023 (CN) ..... 202323437133.9

(51) Int. Cl.
*A01K 15/02* (2006.01)
*G02F 1/1335* (2006.01)
*H05K 1/14* (2006.01)
*H05K 1/18* (2026.01)

(52) U.S. Cl.
CPC ..... *A01K 15/022* (2013.01); *G02F 1/133524* (2013.01); *G02F 1/133526* (2013.01); *H05K 1/14* (2013.01); *H05K 1/18* (2013.01); *H05K 2201/10136* (2013.01)

(58) Field of Classification Search
CPC .. A01K 15/021; A01K 15/022; A01K 15/023; A01K 15/029; A01K 27/009; G02F 1/133524; G02F 1/133526; H05K 1/14; H05K 1/18; H05K 2201/10136
See application file for complete search history.

(56) References Cited

U.S. PATENT DOCUMENTS 4,558,396 A * 12/1985 Kawabata et al. ..... H05K 5/02 455/100
6,523,966 B1 * 2/2003 Satoh ..... G02F 1/133621 362/555
7,707,974 B2 * 5/2010 Schrick ..... A01K 1/031 361/679.01
D706,500 S * 6/2014 Hu ..... D30/152
9,652,975 B1 * 5/2017 Riley ..... G08B 1/08
10,154,651 B2 * 12/2018 Goetzl ..... A01K 15/021
D938,668 S * 12/2021 Jia ..... D10/104.1
(Continued)

FOREIGN PATENT DOCUMENTS

CN 113892439 A * 1/2022

*Primary Examiner* — William E Dondero
(74) *Attorney, Agent, or Firm* — HOWARD M COHN and Associates, LLC

(57) ABSTRACT

The present invention relates to a bark control device. The bark control device includes a main body, a display module, a lens, an anti-barking assembly, and a first circuit board. The first circuit board is disposed in the main body; the first circuit board is electrically connected to the anti-barking assembly and the display module respectively. An outer surface of the main body defines a groove, and a window is disposed in the groove, and the window is in communication with an interior of the main body. The display module is disposed in the main body, and is at least partially disposed in the window. The lens is disposed in the groove and adhered to a bottom surface of the groove by using a waterproof adhesive.

18 Claims, 7 Drawing Sheets

(56) References Cited

U.S. PATENT DOCUMENTS

| | | | | |
|---|---|---|---|---|
| 2005/0145200 | A1* | 7/2005 | Napolez | A01K 15/022 119/718 |
| 2005/0263106 | A1* | 12/2005 | Steinbacher | A01K 27/006 119/858 |
| 2011/0232585 | A1* | 9/2011 | Rich | A01K 27/009 342/458 |
| 2016/0100552 | A1* | 4/2016 | So | A01K 15/022 119/859 |
| 2018/0249680 | A1* | 9/2018 | Van Curen | A01K 15/022 |
| 2018/0368365 | A1* | 12/2018 | Van Curen | A01K 15/021 |
| 2020/0225528 | A1* | 7/2020 | Lee | G02F 1/133602 |
| 2021/0127640 | A1* | 5/2021 | Tarbutton | A01K 15/021 |
| 2021/0227789 | A1* | 7/2021 | Van Curen et al. | A01K 27/009 |
| 2022/0053736 | A1* | 2/2022 | Xiao | A01K 15/021 |
| 2022/0117200 | A1* | 4/2022 | Fronapfel | A01K 27/009 |
| 2022/0361456 | A1* | 11/2022 | Zhang | A01K 15/021 |
| 2023/0172162 | A1* | 6/2023 | Johnson | A01K 15/021 119/712 |

* cited by examiner

BARK CONTROL DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

TECHNICAL FIELD

The application claims priority of Chinese patent application CN2023234371339, filed on Dec. 15, 2023, which is incorporated herein by reference in its entireties.

BACKGROUND ART

As is well known, a bark control device is a product that punishes a dog by means of ultrasound, vibration, and electric shocks to stop the dog from barking. However, in an existing bark control device, a [display] window is disposed on a housing of the bark control device, and a lens used to protect an internal display screen is disposed on a position of a corresponding [display] window of the housing, and a limiting slot is disposed on a circumferential side of the corresponding [display] window on an inner wall of the housing. The lens is generally locked by using a screw on a circuit board, and then compressed by a display. However, when the bark control device is used on rainy days, the rain may easily enter the bark control device through the gap between the lens and the housing, thus affecting the display of the monitor. In addition, an existing housing is generally connected by using screws between the front housing and the rear housing, and product sealing is not good, and is not suitable for use on a rainy day. Therefore, it is necessary to propose improvements to solve this problem.

SUMMARY

A main object of the present invention is to provide a bark control device, so as to resolve a problem of an existing bark control device that rain water may enter the existing bark control device via a gap between a lens and a housing on a rainy day, thus affecting displaying.

To resolve the foregoing technical problem, the technical solution provided in the present invention is as follows.

A barking device includes a main body, a display module, a lens, an anti-barking assembly, and a first circuit board, wherein the first circuit board is disposed in the main body, the first circuit board is electrically connected to the anti-barking assembly and the display module, a groove is disposed on an outer surface of the main body, and a window connected to the main body is disposed in the groove. The window is in communication with an interior of the main body. The display module is disposed in the main body and is at least partially disposed in the window, and the lens is disposed in a groove and adhered to a bottom surface of the groove by using a waterproof adhesive.

Further, the display module includes a second circuit board, a backlight board, and a liquid crystal display screen that are disposed in the main body, the backlight board and the liquid crystal display screen are all welded to one side of the second circuit board near the window, the first circuit board is electrically connected to the second circuit board, the first circuit board is located on one side of the second circuit board away from the display module, the liquid crystal display screen is located on one side of the backlight board away from the first circuit board, and the liquid crystal display screen is at least partially disposed in the window.

Further, the bark control device further includes at least one indicator lamp and a light guide. The at least one indicator lamp is disposed on one side of the second circuit board that is close to the backlight board, and a display opening is defined at the bottom of the groove at two sides of the window; and the light guide is for exporting light of the indicator lamp from the display opening is disposed at a position corresponding to the display opening in the main body.

Further, the light guide is provided with an insertion groove in a side surface that is far away from the [display] window, the light guide is protruded on a side surface away from the insertion groove to form an arcuate bump that matches the display opening, the arcuate bump is disposed in the display opening, the light guide abuts against the second circuit board on a side surface that is far away from the display opening, and the indicator lamp is disposed in the insertion groove;

a plurality of fixed sockets are disposed on the light guide, the main body is provided with a limiting pole beside a display opening and a first wall, the first wall surrounds to form a limiting slot, the limiting pole is disposed in the fixed socket, and the light guide is disposed in the limiting slot.

Further, the display module includes a second circuit board, a light guide plate, and a pattern substrate that are disposed in a main body, where the light guide plate is at least partially disposed in the window, the pattern substrate is attached to a side of the light guide plate close to the groove, and the second circuit board is disposed on a side of the light guide plate far away from the groove; and a transparent pattern for transmitting light is disposed on the pattern substrate, a through hole is disposed in the light guide plate at a position corresponding to the transparent pattern, a light source component is disposed at a position corresponding to the through hole of the second circuit board, and light of the light source component successively passes through the through hole and the transparent pattern, and then the transparent pattern is projected from the lens.

Further, the transparent pattern includes a power supply indication pattern used for transmitting light out and an electric quantity pattern located next to the power supply indication pattern, the through-hole includes a first hole spatially corresponding to the power supply indication pattern and a second hole spatially corresponding to the electric quantity pattern, and the light source component includes a first light emitting body spatially corresponding to the first hole and a second light emitting body spatially corresponding to the second hole.

Further, the transparent pattern includes a vibration indication pattern used to transmit light, the through-hole includes a third hole corresponding to a position of the vibration indication pattern, and the light source component includes a third light emitting body corresponding to a position of the third hole. The vibration indication pattern is circular, and a non-transparent dot is disposed in the middle of the vibration indication pattern, and a plurality of non-transparent arcuate parts are disposed next to the dot.

Further, the transparent pattern includes an electric shock indicator pattern used for transmitting light, the through-hole includes a fourth hole corresponding to a position of the electric shock indicator pattern, and the light source component includes a fourth light emitting body corresponding to a position of the fourth hole. The electric shock indicator pattern is circular, and a non-transparent slash part and broken line parts are disposed on the electric shock indicator pattern, the broken line parts are arranged on two opposite sides of the slash part.

Further, the transparent pattern includes a digital pattern that is used to display the vibration level and is in an "8" shape, the through-hole includes a fifth hole corresponding to a position of the digital pattern, and the light source component includes a fifth light emitting body corresponding to a position of the fifth hole.

Further, the main body includes a front case and a bottom case that is connected to the front case by using ultrasonic waves, the groove and the window are located on the front case, and the display module is fastened to the front case.

Further, the anti-barking assembly includes an electric shock member that is electrically connected to the first circuit board, the electric shock member is located on a side of the first circuit board away from the second circuit board, and the electric shock member at least partially extends beyond the main body.

Further, the electric shock member includes a conductive spring welded to a circuit board, a conductive member that is in contact with the conductive spring, and an electric shock part connected to the conductive member, one end of the conductive member is disposed on an outside of the main body from an inside of the main body, the conductive member and the main body are integrally formed by injection molding, and the electric shock part is disposed on an outside of the main body.

Further, the anti-barking assembly includes a loudspeaker, where the loudspeaker is located on a side of the first circuit board away from the second circuit board, a plurality of sound outlet holes are disposed on an outer side of the main body at a position corresponding to the loudspeaker, a second wall with a first mounting slot is formed in the main body, the second wall is positioned corresponding to a position of the loudspeaker, and the loudspeaker is fixed in the first mounting slot in a gluing manner.

Further, the bark control device further includes a vibration motor electrically connected to the first circuit board, and the vibration motor is located between the second circuit board and the first circuit board and is located on a side of the battery.

Further, the bark control device further includes a microphone that is electrically connected to a first circuit board and that is used to pick up sounds, and the first circuit board is configured for driving the anti-barking assembly to work according to an electrical signal fed back by the microphone.

Further, the bark control device further includes a vibration detection unit disposed in the main body and electrically connected to the first circuit board to detect vibration, the vibration detection unit is configured for feeding back an electrical signal to the circuit board when detecting vibration, and the first circuit board is configured for driving the anti-barking assembly to work according to the electrical signal fed back by the vibration detection unit and the electrical signal fed back by the microphone.

Further, the bark control device further includes a battery electrically connected to the first circuit board, the battery is located between the second circuit board and the first circuit board, a first connector is disposed on a side of the second circuit board near the first circuit board, a second connector is disposed on a side of the first circuit board near the second circuit board, the first connector is connected to the second connector, and the first connector is located next to the battery.

Further, the battery is a rechargeable battery, a charging pin electrically connected to the first circuit board is disposed on a side away from the window of the main body, and the charging pin is fixed to the main body in a glue or injection molding manner. A magnetic attraction member is disposed on the side of the charging pin of the main body.

Further, a function key is disposed on a side of the first circuit board away from the second circuit board, a pressing member is disposed corresponding to a position of the function key of the main body, one end of the pressing member abuts against the function key and the other end projects outside the main body, and the pressing member is fixed to the main body on the side that is close to the window via glue.

Further, the function key includes a first switch that is disposed on the first circuit board and that is used for power-on and power-off, and a second switch that is used for switching mode, and the first circuit board is configured for receiving a signal of the second switch and switch output to the electric shock or the vibration motor and/or drive the speaker to work according to a feedback signal.

The present invention has the following beneficial effects: compared with the prior art, in the present invention, a lens is connected to a main body in an injection molding manner, so that water can be effectively prevented from entering from a gap between the lens and the main body. The problem of the existing bark control device, that rain water may easily enter a gap between the lens and a housing on a rainy day, is solved.

BRIEF DESCRIPTION OF THE DRAWINGS

Implementations of the present disclosure will now be described, by way of embodiment, with reference to the attached figures. It should be understood, the drawings are shown for illustrative purpose only, for ordinary person skilled in the art, other drawings obtained from these drawings without paying creative labor by an ordinary person skilled in the art should be within scope of the present disclosure.

DETAILED DESCRIPTION OF THE EMBODIMENTS

Figure 1:
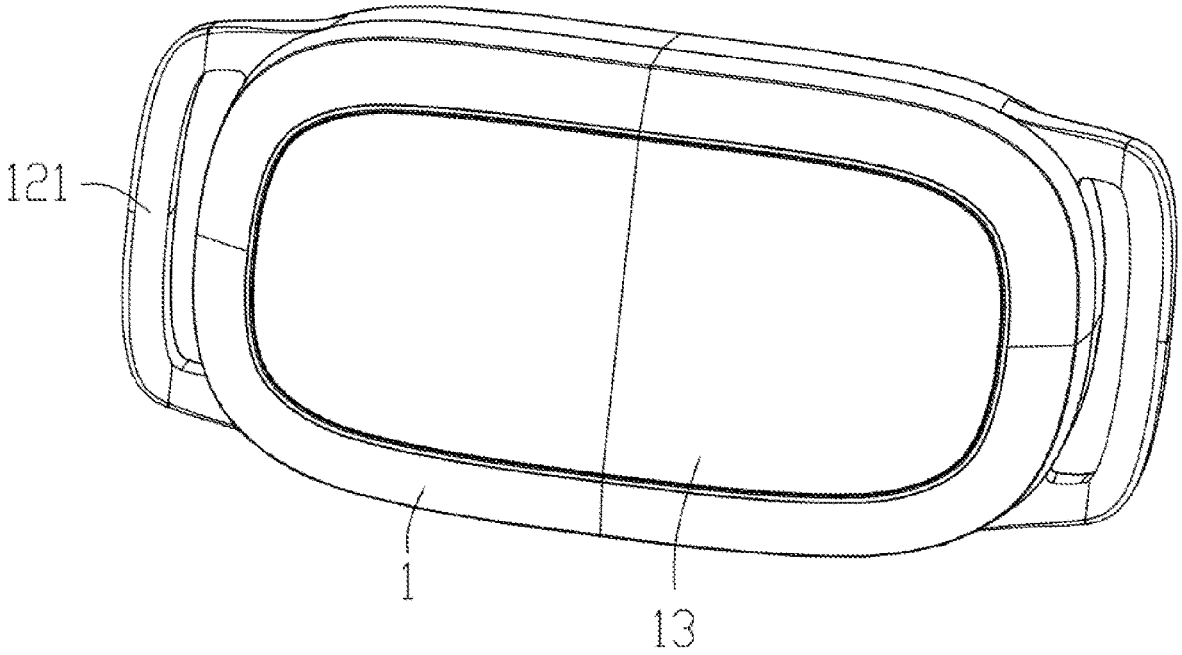
FIG. 1 is a perspective view of an embodiment of the present invention.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". In addition, the terms "first" and "second" are used for descriptive purposes only and cannot be understood as indicating or implying relative importance or implying the number of indicated technical features. Thus, the features defined as "first" and "second" may explicitly or implicitly include one or more of the said features. In the description of embodiments of the application, "a plurality of" means two or more, unless otherwise specifically defined.

Referring to FIG. 1 to FIG. 11, an embodiment of the present invention provides a bark control device.

Figure 2:
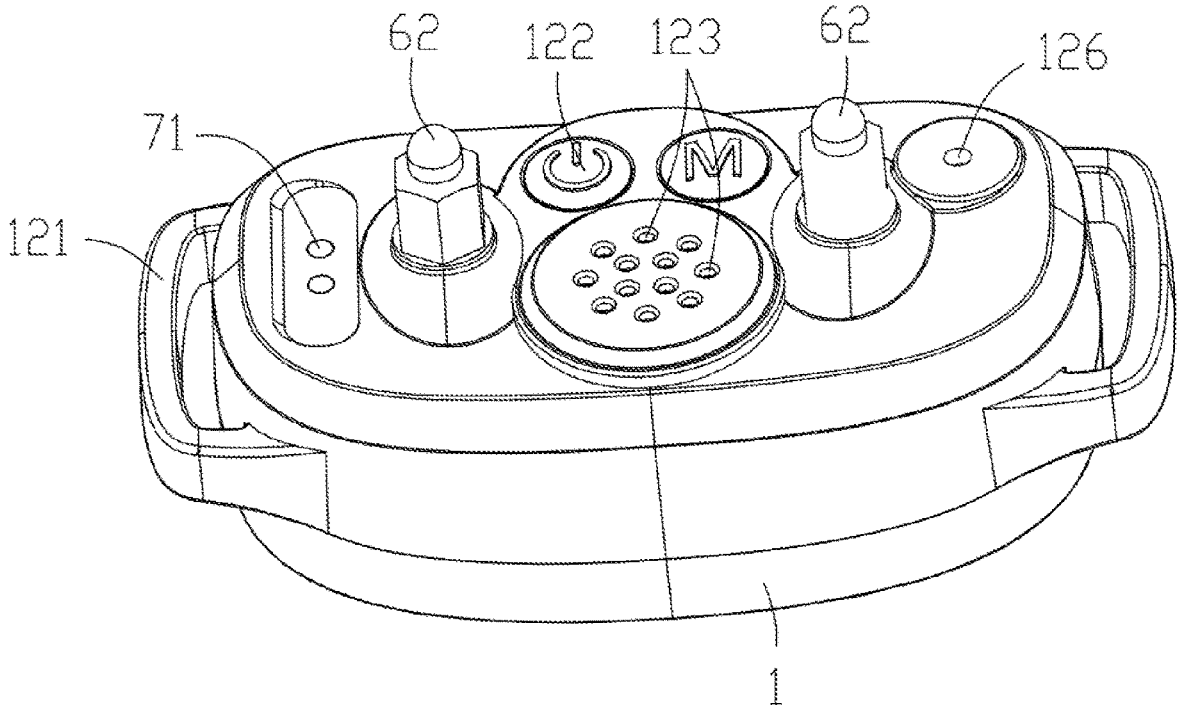
FIG. 2 is a perspective view of another angle of view according to an embodiment of the present invention.
Figure 3:
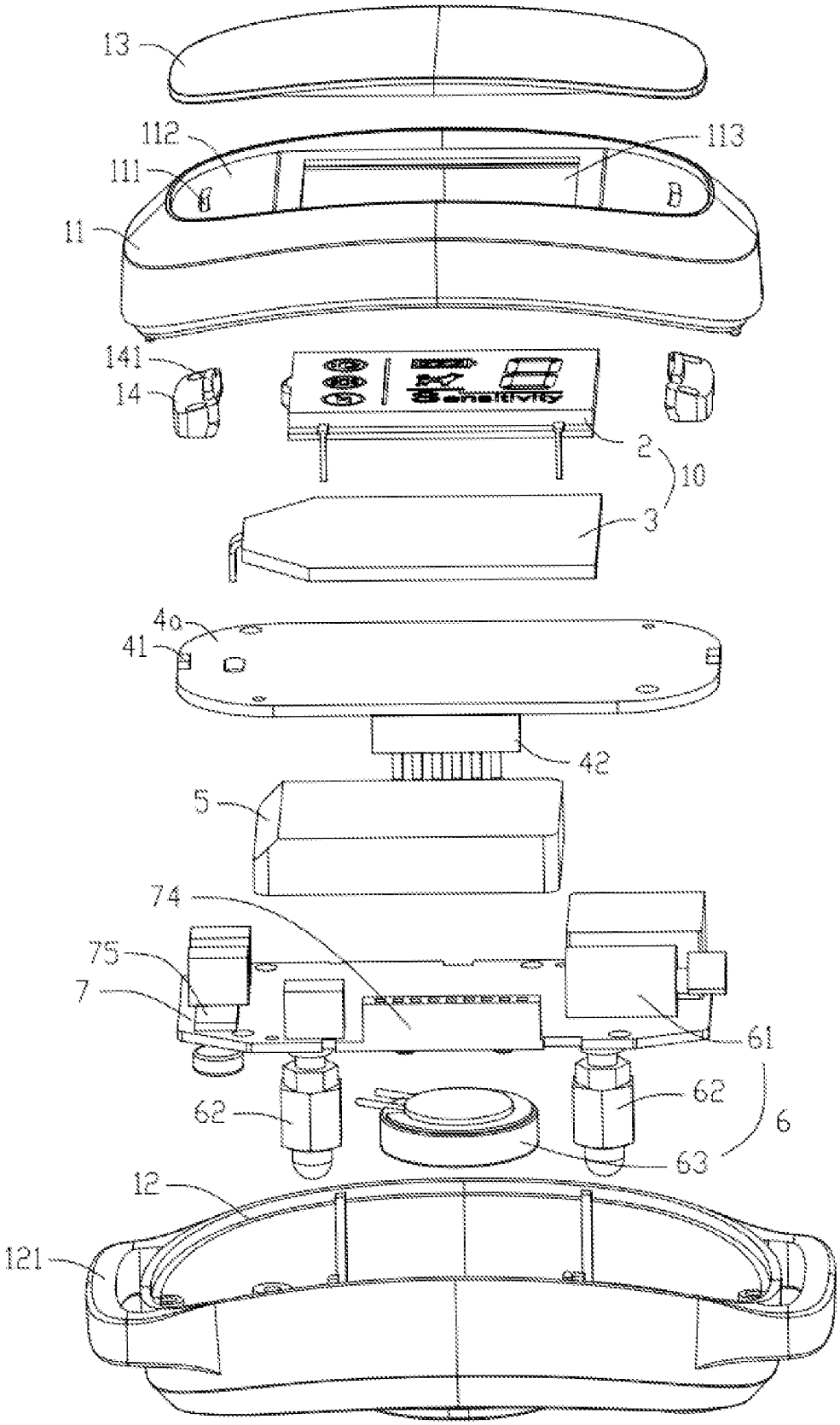
FIG. 3 is an explosion diagram of an embodiment of the present invention.

Referring to FIGS. 1-3, the barking device includes a main body 1, a display module 10, a lens 13, an anti-barking assembly 6, and a first circuit board 7. The first circuit board 7 is disposed in the main body 1. The first circuit board 7 is electrically connected to the anti-barking assembly 6 and the display module 10 respectively, and a groove 112 is disposed on an outer surface of the main body 1, and a window 113 is disposed in the groove 112. The window 113 is in communication with an interior of the main body 1. The display module 10 is disposed in the main body 1 and at least partially in the window 113, and the lens 13 is disposed in the groove 112 and adhered to the bottom surface of the groove 112 by using waterproof adhesive.

In this embodiment, the barking component 6 is configured to prevent a dog from barking when the barking component 6 is driven by the first circuit board 7. In addition, in this embodiment, the lens 13 is connected to the main body 1 in an injection molding manner. In this way, water can be effectively prevented from entering from a gap between the lens 13 and the main body 1, thus achieving a sealing effect. This resolves the problem of existing bark control device that rain may easily enter a gap between the lens 13 and the housing on a rainy day.

Specifically, in an embodiment, a bottom surface of the lens 13 is pasted with a bottom surface of the groove 112 at a position away from the window 113 by using a waterproof adhesive. A length of the groove 112 is greater than a length of the window 113. A width of the groove 112 is greater than a width of the window 113. The waterproof adhesive is preferably 3M waterproof adhesive. The display module 10 includes a second circuit board 4a, a backlight plate 3, and a liquid crystal display screen 2 that are disposed in the main body 1. Both the backlight plate 3 and the liquid crystal display screen 2 are welded to one side of the second circuit board 4a that is close to the window 113, and the backlight plate 3 and the liquid crystal display screen 2 are fastened. The first circuit board 7 is electrically connected to the second circuit board 4a; the first circuit board 7 is located on a side of the second circuit board 4a away from the display module 10. The liquid crystal display screen 2 is located on a side of the backlight board 3 away from the first circuit board 7. The liquid crystal display screen 2 is at least partially disposed in the window 113, so as to further improve waterproof performance.

In an embodiment, at least one indicator 41 is disposed on one side of the second circuit board 4a close to the backlight board 3. Two display openings 111 are defined at a bottom of the groove 112 on both sides of the window 113. The display openings 111 are in communication with an interior of the main body 1. A light guide 14 for exporting light of the indicator 41 from the display opening 111 is disposed in the main body 1 at a position corresponding to the display opening 111, and light of the indicator 41 may be exported by using the light guide 14, so as to serve as an indication function. Specifically, the indicator 41 may be used to indicate when the battery 5 is charged, indicate when the battery 5 is powered on, or indicate when the barking component 6 is activated.

Figure 4:
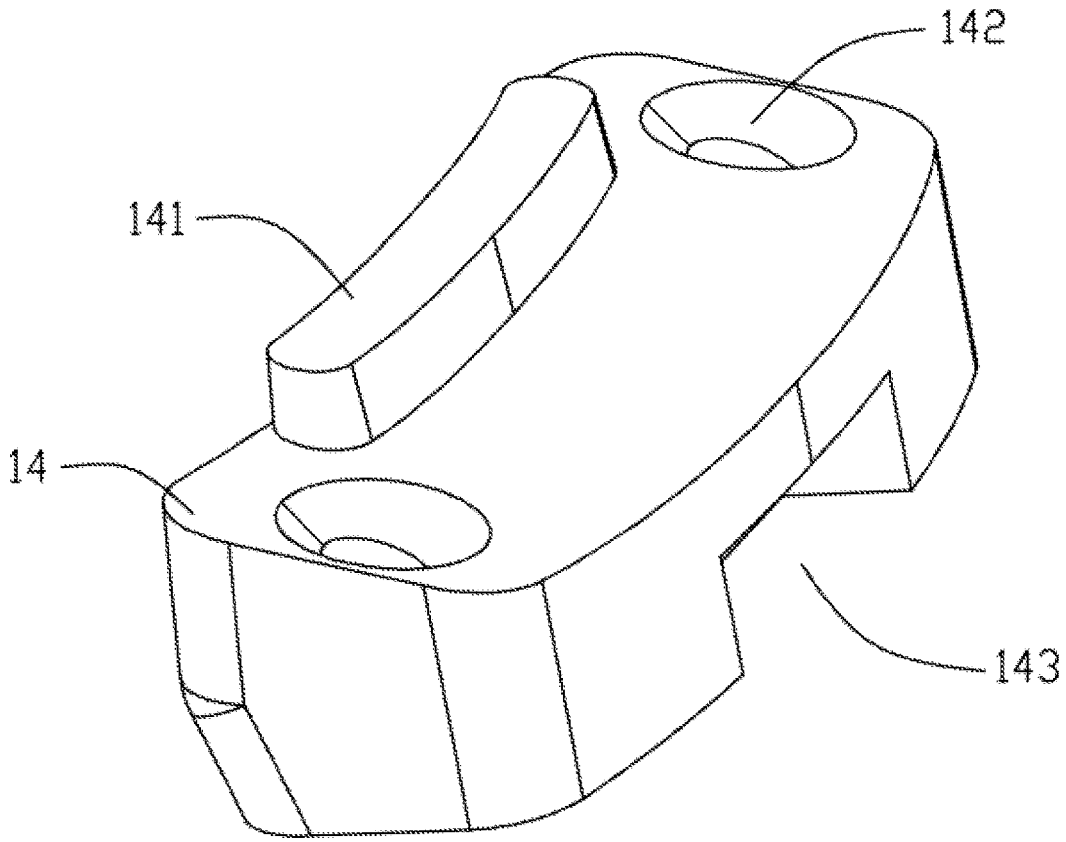
FIG. 4 is a structural diagram of a light guide according to an embodiment of the present invention.
Figure 5:
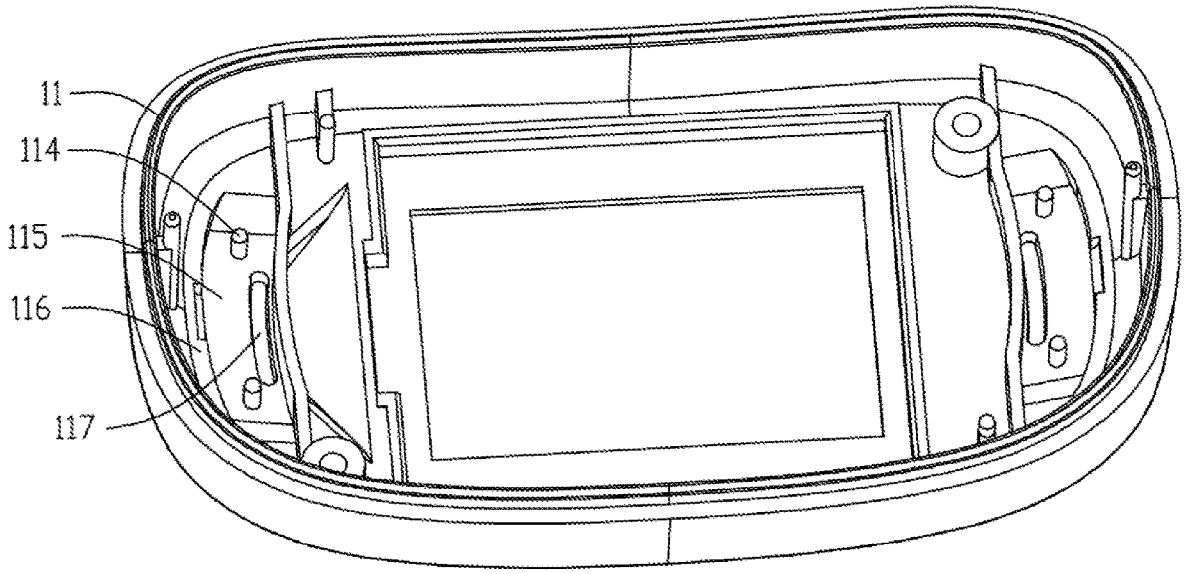
FIG. 5 is a structural diagram of a front case according to an embodiment of the present invention.
Figure 6:
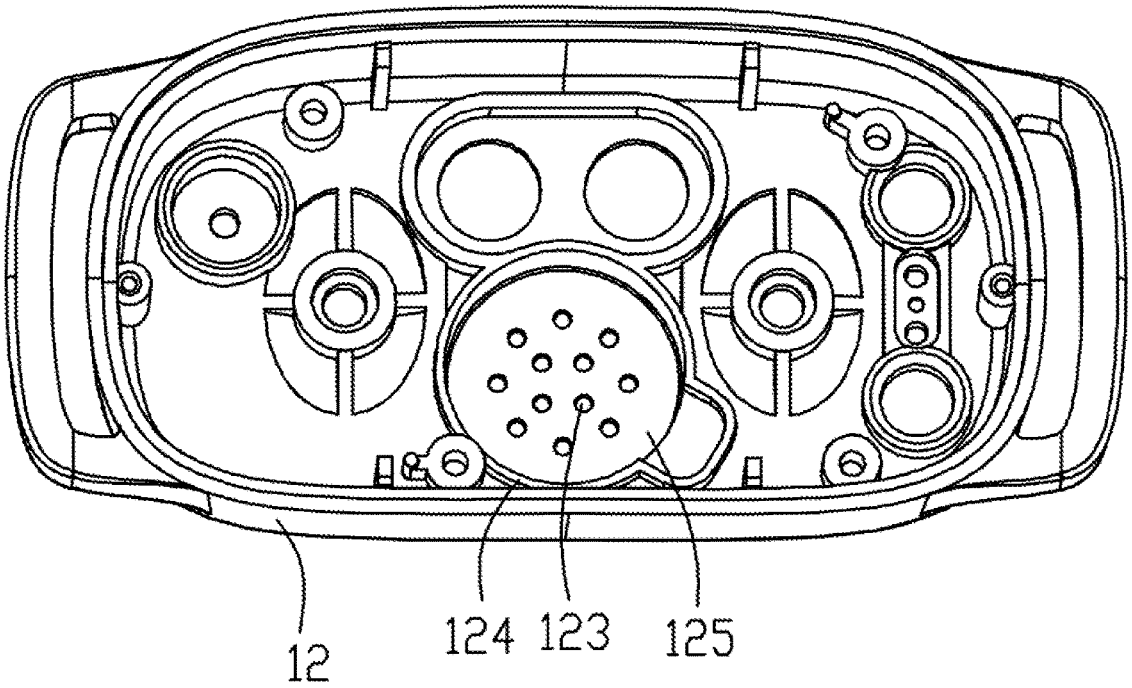
FIG. 6 is a structural diagram of a bottom housing according to an embodiment of the present invention.

In practical application, referring to FIGS. 3-5, the light guide 14 is provided with an insertion groove 143 on a side far away from the [display] window 113. The light guide 14 is protruded on a side that is far away from the insertion groove 143 to form an arcuate bump 141 that matches the display opening 111, and the arcuate bump 141 is disposed in the display opening 111. A side surface of the light guide 14 away from the display opening 111 abuts against the second circuit board 4a. The indicator 41 is disposed in the insertion groove 143, so as to effectively export light of the indicator 41 from the display opening 111. The exported light is in an arcuate shape.

In practical application, the light guide 14 may be light permeable flexible plastic. A plurality of fixed sockets 142 are disposed on the light guide 14. A limiting pole 114 is disposed on a side of the display opening 111 of the main body 1. A first wall 116 is provided in the main body 1 adjacent to the display opening 111 to form a limiting groove 115. The limiting rod 114 is disposed in the fixed socket 142, and the light guide 14 is disposed in the limiting groove 115. In this way, the light guide 14 achieves a sealing effect by pressing the second circuit board 4a and the main body 1, thus achieving a waterproof effect. The limiting pole 114 can limits the position of the light guide 14, so as to and prevent the light guide 14 from being severely deformed and prevent light from being squeezed when the light guide 14 is installed. Certainly, in other embodiments, the light guide 14 may further be made of light permeable hard plastic.

In practical application, there may be two indicators 41, and are respectively located on two sides of the liquid crystal display screen 2. There are two light guides 14, and each of the light guides 14 is arranged corresponding to an indicator 41 respectively.

In an embodiment, the main body 1 includes a front case 11 and a bottom case 12 that is connected to the front case 11 by using ultrasonic waves, so as to seal the bottom case 12 and the front case 11, thereby providing a waterproof function. Specifically, the groove 112 and the window 113 are located on the front case 11, and the display module 10 is fastened to the front case 11. Certainly, in other embodiments, the bottom case 12 and the front case 11 may further be fastened by using screws, and glue to implement a sealing effect.

In practical application, both sides of the front case 11 or the bottom case 12 are provided with a fixed earpiece 121 that is used for fixing a necklace. After the fixed earpiece 121 is connected to the pet necklace, the bark control device in this embodiment may be installed on the neck or body of the pet by using the necklace. When the pet is barking, the user may use remote control to drive the anti-barking assembly 6 to work by using the first circuit board 7. For example, when the anti-barking assembly 6 is an ultrasonic wave device, the pet may be punished, and the frightened pet stops barking, and thus achieving the effect of stop barking.

In practical application, referring to FIG. 3, the anti-barking assembly 6 includes an electric shock member 62 electrically connected to the first circuit board 7. The electric shock member 62 is located on a side of the first circuit board 7 away from the second circuit board 4a, and the electric shock member 62 extends at least partially outside of the main body 1. Therefore, the first circuit board 7 outputs a voltage to the electric shock member 62, thus punishing a pet.

Figure 7:
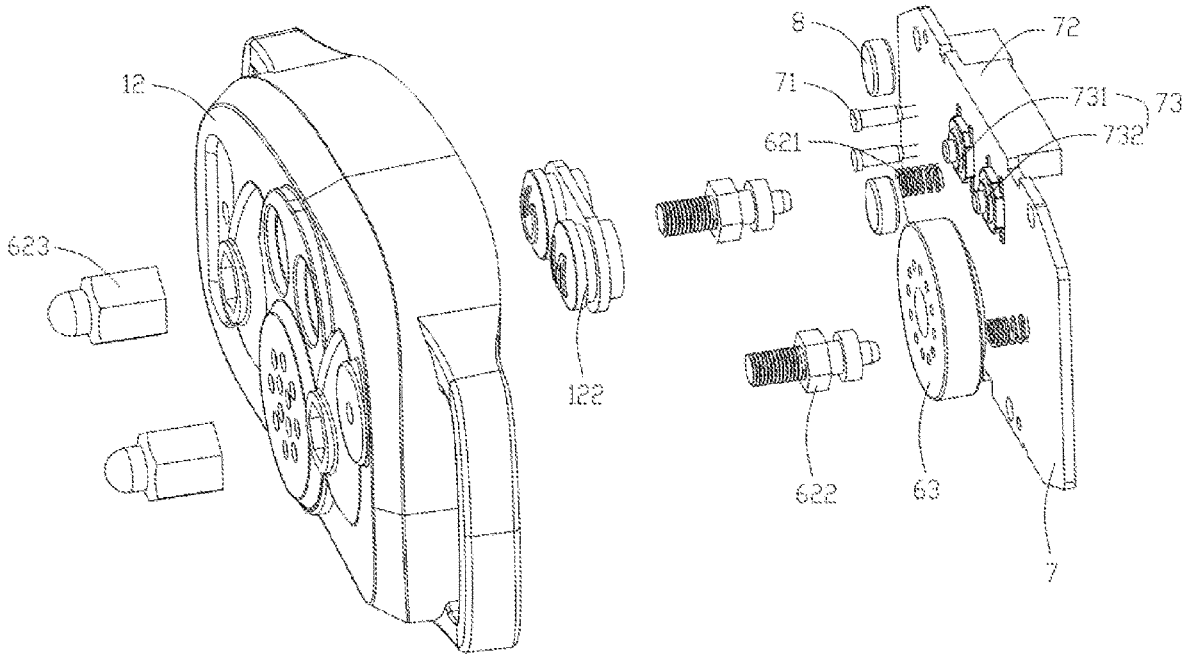
FIG. 7 is a partial exploded view of an embodiment of the present invention.
Figure 8:
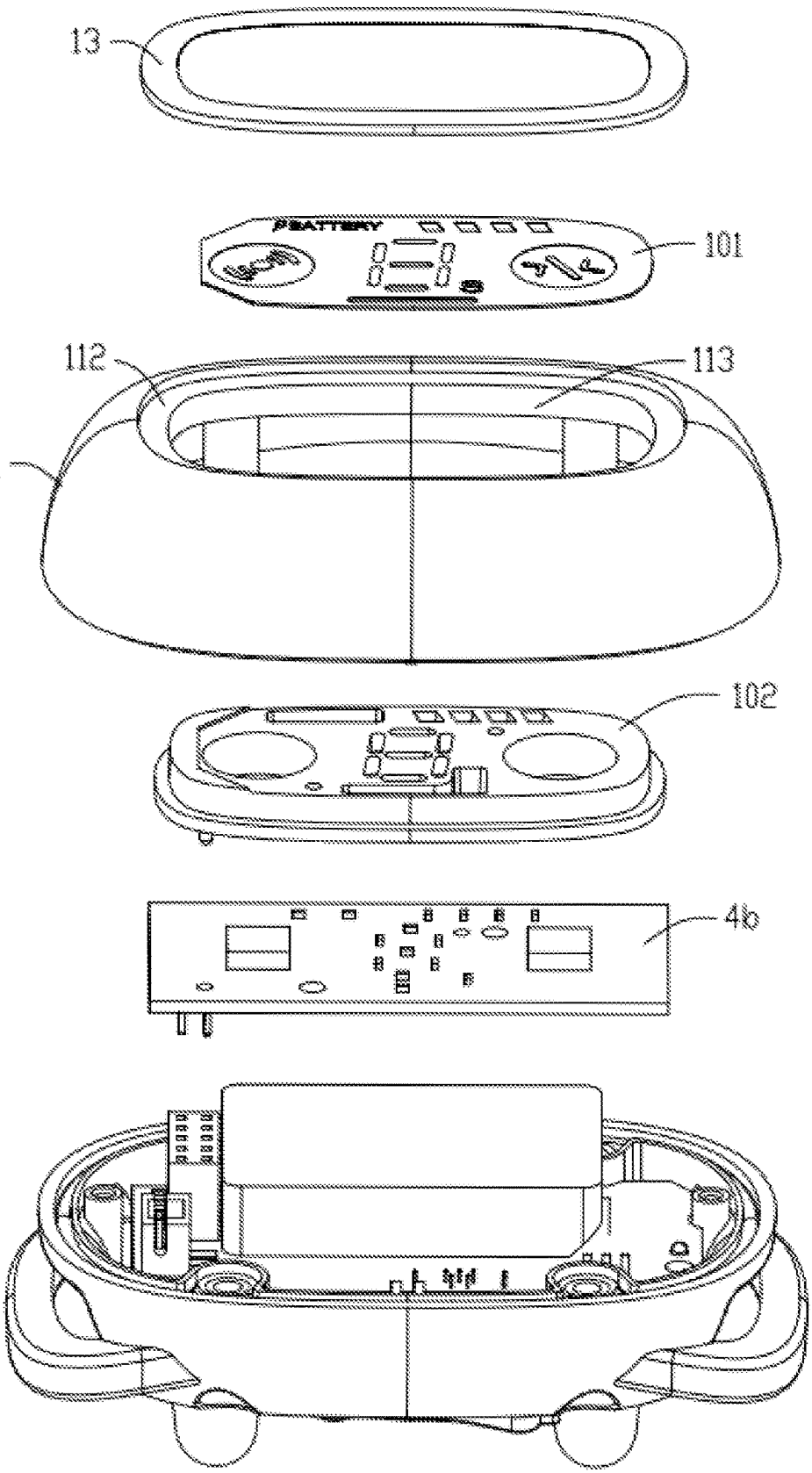
FIG. 8 is a partial exploded view of another embodiment of the present invention.
Figure 9:
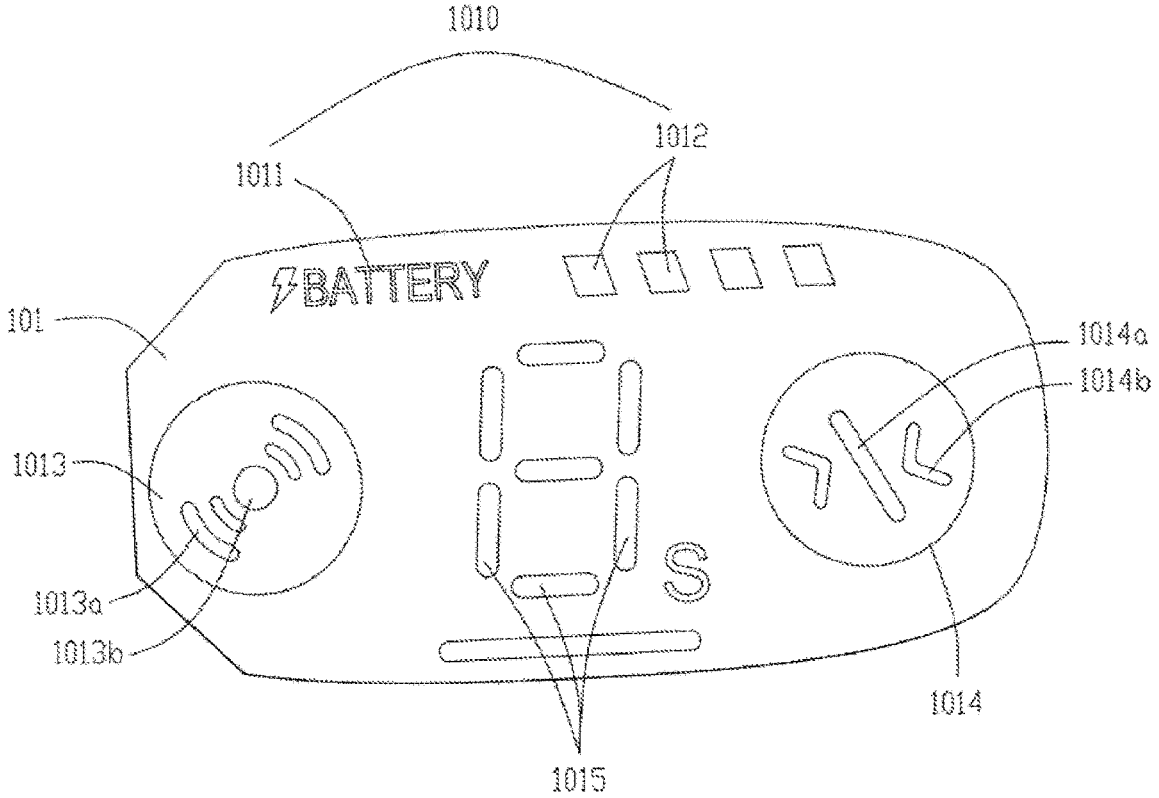
FIG. 9 is a structural diagram of a pattern substrate according to another embodiment of the present invention.
Figure 10:
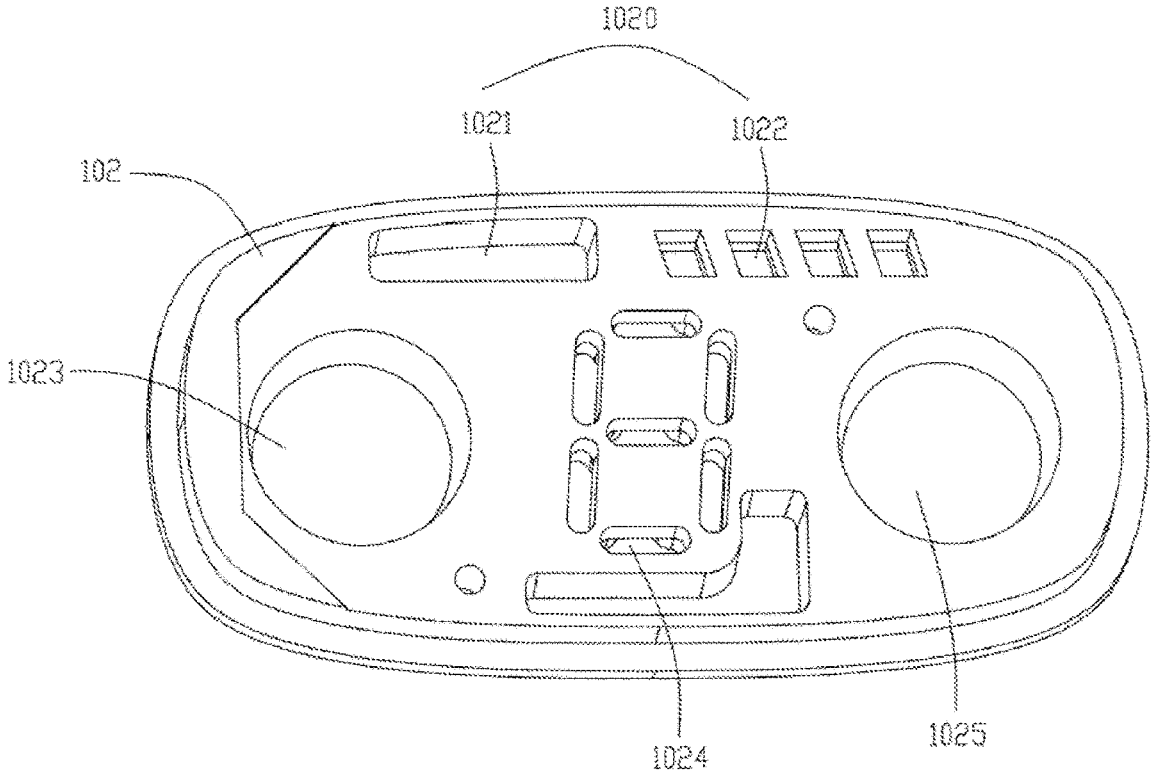
FIG. 10 is a structural diagram of a light guide board block according to another embodiment of the present invention.
Figure 11:
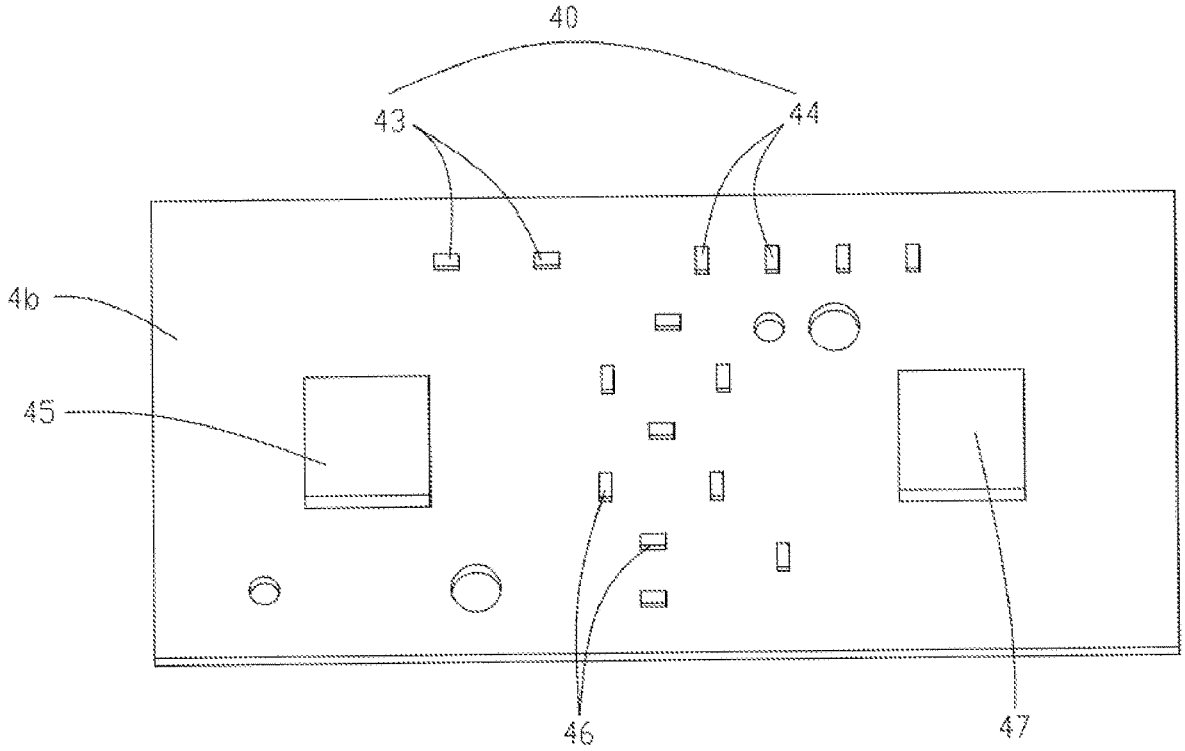
FIG. 11 is a structural diagram of a second circuit board according to another embodiment of the present invention.

Specifically, referring to FIG. 7, the electric shock member 62 includes a conductive spring 621 welded to the circuit board, a conductive member 622 that is in contact with the conductive spring 621, and an electric shock portion 623 connected to the conductive member 622. One end of the conductive member 622 protrudes from an inside of the main body 1 to an outside of the main body 1. The conductive member 622 is formed by injection molding in an integrated manner with the main body 1, and the electric shock portion 623 is located on the outside of the main body 1. The conductive part 622 and the main body 1 are integrally formed, so that the electric shock member 62 and the main body 1 can be sealed and waterproof. In addition, the conductive spring 621 can be used to electrically connect the first circuit board 7 to the electric shock part 623. In this way, a voltage output by the first circuit board 7 is output to the electric shock part 623 by using the conductive part 622, so that a pet can be punished when the electric shock part 623 contacts a pet. The electric shock part 623 is connected to the conductive part 622 by means of threads, and the user may use the electric shock part 623 of different lengths according to different pets. For example, when the hair of the pet is short, the user can use the electric shock part 623 of a relatively short length. When the hair of the pet is long, the user can use the electric shock part 623 of a relatively larger length.

In practical application, the anti-barking assembly 6 includes a loudspeaker 63, and the loudspeaker 63 is located on a side of the first circuit board 7 away from the second circuit board 4a. A plurality of sound outlets 123 are disposed on an outer side of the main body 1 at a position corresponding to the loudspeaker 63. The main body 1 forms a second wall 124 having the first mounting groove 125 internally corresponding to the loudspeaker 63. The loudspeaker 63 is disposed in the first mounting groove 125, and is fastened via glue between the loudspeaker 63 and a sidewall of the first mounting groove 125. In this way, water can be prevented from entering from the loudspeaker 63. The loudspeaker 63 may sound when the pet barks, thus stopping barking.

In practical application, referring to FIG. 3, the bark control device further includes a vibration motor 61 that is electrically connected to the first circuit board 7. The vibration motor 61 is located between the second circuit board 4a and the first circuit board 7 and is located on a side of the battery 5. When a pet barks, the first circuit board 7 may drive the vibration motor 61 to vibrate when the user controls or the first circuit board 7 detects a pet barking, so that the bark control device in this embodiment vibrates and plays a role of punishing a pet, thereby playing a role of stopping barking.

In an embodiment, the bark stop further includes a microphone 126 disposed in the main body 1 and electrically connected to the first circuit board 7 to pick up sounds. The first circuit board 7 operates according to an electrical signal fed back by the microphone 126 to drive the bark stop assembly 6. After the microphone 126 picks up the sounds when the dog barks, the first circuit board 7 drives the anti-barking assembly 6 to work when the voltage of the electrical signal fed back by the microphone is greater than a specific voltage, for example, drives the speaker 63 to sound, drives the vibration motor 61 to vibrate, or outputs the voltage to the shock part 623 to electrically shock the pet, thus achieving a penalty function.

In an embodiment, the bark control device further includes a vibration detection unit 75 disposed on the main body 1 and electrically connected to the first circuit board 7 to detect vibration. When detecting vibration, the vibration detection unit 75 feeds back an electrical signal to the first circuit board 7. The first circuit board 7 works according to the electrical signal fed back by the vibration detection unit 75 and the electrical signal fed back by the microphone. In practical use, when the barking device is fastened to the neck of the pet by using a necklace, the vibration detection unit 75 adheres to a position of a throat of the pet. When the pet calls, the vibration detection unit 75 may detect a movement of the throat of the pet, so as to feed back an electrical signal to the first circuit board 7, and when the pet calls, the sound may be picked up by the microphone. The first circuit board 7 drives the anti-barking assembly 6 to work according to the two electrical signals, so as to prevent a pet from being punished by mistake when other sounds are relatively large. When there are many pets, a pet's call may cause all pets to be punished. The vibration detection unit 75 can improve the precision of punishment. Specifically, the vibration detection unit 75 may be an acceleration sensor, a gyroscope, or the like.

In any one of the foregoing embodiments, the bark control device further includes a battery 5 electrically connected to the first circuit board 7. The battery 5 is located between the second circuit board 4a and the first circuit board 7, a first connector 74 is disposed on a side near the first circuit board 7, and a second connector 42 is disposed on a side near the second circuit board 4a. The first connector 74 is connected to the second connector 42, and the first connector 74 is located beside the battery 5.

The battery 5 may supply power to the first circuit board 7, and is connected to the second connector 42 by using the first connector 74, so as to supply power to the second circuit board 4a. In addition, the first circuit board 7 may be stably connected to the second circuit board 4a by using the first connector 74 and the second connector 42, and the second circuit board 4a is controlled by using the first circuit board 7, so as to control content displayed by the display module 10.

In an embodiment, referring to FIG. 7, the battery 5 is a rechargeable battery 5. A charging pin 71 electrically connected to the first circuit board 7 is disposed on a side of the main body 1 away from the window 113, and a magnetic attraction member 8 is disposed on a side of the charging pin 71. The charging pin 71 is connected to an external charger, and the battery 5 may be charged by using the first circuit board 7. The charging pin 71 is fixed to the main body 1 via glue or injection molding, so as to implement sealing at the charging pin 71, and play a waterproof role. In other embodiments, a charging interface that is electrically connected to the first circuit board 7 may be disposed on the main body 1, a rubber plug is disposed at the charging interface corresponding to the main body 1, and may also be implemented. When the charging interface is connected to a power supply, the battery 5 may be charged by using the first circuit board 7.

In another embodiment, the display module 10 may further be other structures. Specifically, referring to FIGS. 8-11, the display module 10 includes a second circuit board 4b in the main body 1, a light guide plate 102 in the main body 1, and a pattern substrate 101 disposed in the main body 1. The light guide plate 102 is at least partially disposed in the window 113 and fixed to the window 113 by applying glue. The pattern substrate 101 is attached to a side of the light guide plate 102 that is close to the groove 112, and the second circuit board 4b is disposed on a side of the light guide plate 102 away from the groove 112. A transparent pattern 1010 for transmitting light is disposed on the pattern substrate 101. A through hole 1020 is disposed in a position corresponding to the transparent pattern 1010 of the light guide plate 102. A light source component 40 is disposed in a position corresponding to the through hole 1020 of the second circuit board 4b. Light of the light source component 40 successively passes through the through hole 1020 and the transparent pattern 1010, and then the transparent pattern 1010 is projected out of the lens 13 to display of a corresponding pattern, which is convenient to use for the user. The part of the pattern substrate 101 at the position of the transparent pattern 1010 is made of light-permeable material, and the other part of the pattern substrate 101 is made of opaque material. Thus, light emitted by a light source passes through the through hole 1020 and the transparent pattern 1010, thus forming a luminous transparent pattern 1010 and achieving a display effect.

In practical application, the display module 10 may be configured to display an electric quantity of the battery 5. That is, the transparent pattern 1010 includes a power supply indication pattern 1011 used to emit light and an electric quantity pattern 1012 located next to the power supply indication pattern 1011. The through hole 1020 includes a first hole 1021 corresponding to a position of the power supply indication pattern 1011, and a second hole 1022 corresponding to a position of the electric quantity pattern 1012. The light source component 40 includes a first light emitting body 43 corresponding to a position of the first hole 1021 and a second light emitting body 44 corresponding to a position of the second hole 1022.

The power supply indication pattern 1011 may be in a "BATTERY" shape and an identifier of other patterns, and the electric quantity pattern 1012 may be a pattern such as a rectangle, a square, or a circle in which multiple lamps are distributed. For example, the electric quantity pattern 1012 may be four rectangles, and a quantity of the second light emitting bodies 44 is four, and a quantity of the second holes 1022 is four. When the battery 5 is fully charged, the four second light emitting bodies 44 emit light, that is, all the four rectangular patterns are lightened in a visual effect. When the electric quantity of the battery 5 is half of the battery capacity, the two second light emitting bodies 44 emit light. That is, in a visual effect, it can be seen that the two rectangular patterns are illuminated, so that the user can understand.

In practical application, the display module 10 may indicate when the vibration motor 61 operates. Specifically, the transparent pattern 1010 includes a vibration indication pattern 1013 used to emit light, the through hole 1020 includes a third hole 1023 corresponding to a position of the vibration indication pattern 1013, and the light source component 40 includes a third light emitting body 45 corresponding to a position of the third hole 1023. The vibration indication pattern 1013 is circular, and an opaque circular dot 1013b is disposed in the middle, and a plurality of opaque arcuate portions 1013a are disposed beside the dot 1013b. That is, when the third light emitting body 45 is working, the vibration indication pattern 1013 may be shown by using the lens 13, thus indicating a working state of the vibration motor 61.

In practical application, the display module 10 may indicate when the shock part 62 is working. Specifically, the transparent pattern 1010 includes an electric shock indicator pattern 1014 used to emit light, the through hole 1020 includes a fourth hole 1025 corresponding to a position of the electric shock indicator pattern 1014, and the light source component 40 includes a fourth light emitting body 47 corresponding to a position of the fourth hole 1025. The shock indicator pattern 1014 is circular, and an optically opaque slash portion 1014a and a broken line portion 1014b on both sides of the slash portion 1014a. That is, when the electric shock member 62 works, the fourth light emitting body 47 emits light, the vibration indication pattern 1013 is displayed by using the lens 13, thus indicating a working state of the electric shock member 62.

In practical application, the display module 10 may be further configured to indicate electric shock strength of the electric shock member 62 or vibration strength of the vibration motor 61. The transparent pattern 1010 includes a digital pattern 1015 that is configured to display the vibration level and is in an "8" shape. The through hole 1020 includes a fifth hole 1024 corresponding to a position of the digital pattern 1015, and the light source component 40 includes a fifth light emitting body 46 corresponding to a position of the fifth hole 1024. Specifically, a quantity of the fifth light emitting bodies 46 is seven, and a quantity of the fifth holes 1024 is seven. The fifth light emitting bodies 46 and the fifth holes 1024 are distributed in an "8" shape. When there are 4 levels for each of the shock strength and vibration levels in total, the number "3" is displayed when the shock strength or vibration level is in level 3.

In practical application, referring to FIG. 7, a function key 73 is disposed on one side of the first circuit board 7 away from the second circuit board 4a, and a pressing member 122 is disposed on the main body 1 at a position corresponding to the function key 73. One end of the pressing member 122 may be in contact with the function key 73, and the other end projects outside of the main body 1. The pressing member 122 is fastened to the main body 1 on one side of the window 113 via glue, thereby implementing sealing at the function key 73. Specifically, the function key 73 is made of flexible plastic, so the function key 73 can restore after being pressed. The function key 73 is fastened to the main body 1 in a snap-fit manner. The function key 73 includes a first switch 731 that is disposed on a circuit board and that is configured to switch on or off, and a second switch 732 that is configured to switch modes. The first circuit board 7 is configured to receive a signal of the second switch 732, and switch, according to a feedback signal, output to the electric shock member 62 or the power of the motor and/or drive the speaker 63 to work. The second switch 732 can adjust the electric shock strength of the electric shock member 62 or the vibration strength of the vibration motor 61.

In practical application, the structure of this embodiment is compact, and there are two shock members 62. Both the loudspeaker 63 and the pressing member 122 are located between the two shock members 62. The loudspeaker 63 is on the top of the first circuit board 7, and the pressing member 122 is at the bottom of the first circuit board 7. The charging pin 71 is located on a side of the shock member 62 away from the loudspeaker 63.

The above description only describes embodiments of the present disclosure, and is not intended to limit the present disclosure, various modifications and changes can be made to the present disclosure. Any modifications, equivalent substitutions, improvements, etc. made within the spirit and scope of the present disclosure are intended to be included within the scope of the present disclosure.

What is claimed is:

1. A bark control device, comprising a main body, a display module *in the main body*, a lens, an anti-barking assembly, and a first circuit board[, the first circuit board being disposed] in the main body,

*wherein* the first circuit board [being] *is* electrically connected to the anti-barking assembly and the display module [respectively, an outer surface of] *;*

*wherein* the main body [defining] *defines* a groove, and *comprises* a window [being disposed in] *;*

*wherein* the [groove, the window being in communication with an interior of the main body; the] display module [being disposed in the main body, and being] *is* at least partially [disposed in the window, and the lens being disposed in the groove and adhered to a bottom surface of the groove by using a waterproof adhesive] *visible through the window and the lens is in the groove and adhered to a bottom surface of the groove by a waterproof adhesive*;

wherein the anti-barking assembly comprises an electric shock member electrically connected to [a] *the* first circuit board, the electric shock member is located on a side of the first circuit board away from the [second circuit board] *display module*, and the electric shock member at least partially extends beyond the main body;

wherein the electric shock member comprises a conductive spring welded on a circuit board, a conductive member in contact with the conductive spring, and an electric shock part connected to the conductive member, one end of the conductive member is disposed on an outside of the main body from an inside of the main body, the conductive member and the main body are integrally formed by injection molding, and the electric shock part is disposed on an outside of the main body.

2. The bark control device according to claim 1, wherein the display module *further* comprises a second circuit board, a backlight board, and a liquid crystal display screen [that are disposed in the main body, the backlight board and the liquid crystal display screen are welded to one side of the second circuit board near the window], the first circuit board is electrically connected to the second circuit board, the first circuit board [is located on one side of the second circuit board away from the] *and the* display module *are on opposite sides of the second circuit board*, the liquid crystal display screen [is located at one side of the backlight board away from] *and* the first circuit board *are on opposite sides of the backlight board*, and the liquid crystal display screen is at least partially [located in] *visible through* the window.

3. The bark control device according to claim 2, further comprising [at least one] *an* indicator [lamp] and a light guide, wherein the [at least one] indicator [lamp is disposed] *and the backlight board are* on [one] *a same* side of the second circuit board [that is adjacent to the backlight board], and *the main body has* a display opening [is defined at the bottom of the groove at both sides of the window, and the opening is in communication with the interior of the main body; and the light guide is for exporting] *and*

*wherein the light guide is configured to direct* light of the indicator [lamp from] *through* the display opening[, the light guide is disposed at a position corresponding to the display opening in the main body].

4. The bark control device according to claim 3, wherein the light guide [is provided with] *comprises a bump extending through the display opening and* an insertion groove [in a side surface that is away from the display window, the light guide is protruded on a side surface away from the insertion groove to form an arcuate bump that matches the display opening, the arcuate] *opposite the* bump [is disposed in the display opening, the light guide abuts against the second circuit board on a side surface that is far away from the display opening], and the indicator [lamp] is [disposed] in the insertion groove[; and].

[a plurality of fixed sockets are disposed on the light guide, the main body is provided with a limiting pole beside a display opening and a first wall, the first wall surrounds to form a limiting slot, the limiting pole is disposed in the fixed socket, and the light guide is disposed in the limiting slot.]

5. The bark control device according to claim 3, further comprising a vibration motor electrically connected to the first circuit board[, wherein the vibration motor is located between the second circuit board and the first circuit board] *and configured to vibrate the bark control device*.

6. The bark control device according to claim 1, wherein the display module comprises a second circuit board, a light guide plate, and a pattern substrate [disposed in the main body, the light guide plate is at least partially disposed in the window, the pattern substrate is attached to a side of the light guide plate adjacent to the groove, and the second circuit board is disposed on a side of the light guide plate away from the groove; and],

[a transparent pattern for transmitting] *wherein the* light *guide plate* is [disposed on] *at least partially visible through the window, ;*

*wherein* the pattern substrate[,] *comprises a transparent pattern, the light guide plate comprises* a through hole [is disposed in the light guide plate at a position corresponding to] *through which* the transparent pattern[,] *is exposed;*

*wherein the second circuit board comprises* a light source component [is disposed at a position corresponding to the through hole of the second circuit board, and] *configured to emit* light [of the light source component successively passes] through the through hole and the transparent pattern[, and then the transparent pattern is projected from the lens].

7. The bark control device according to claim 6, wherein the transparent pattern comprises a power supply indication pattern [used for transmitting light out] and an electric quantity pattern [used for transmitting light out], the through hole comprises a first hole [spatially corresponding to]

*through which* the power supply indication pattern *is exposed* and a second hole [spatially corresponding to] *through which* the electric quantity pattern *is exposed*, and the light source component comprises a first light emitting body [spatially corresponding to] *configured to emit light through* the first hole and a second light emitting body [spatially corresponding to] *configured to emit light through* the second hole.

8. The bark control device according to claim 7, wherein the transparent pattern comprises a vibration indication pattern [used to transmit light], the through[-] hole comprises a third hole [corresponding to a position of] *through which* the vibration indication pattern *is exposed*, and the light source component comprises a third light emitting body [corresponding] *configured* to [a position of] *emit light through* the third hole[; and the vibration indication pattern is circular, and a non-transparent dot is disposed in the middle of the vibration indication pattern, and a plurality of non-transparent arcuate parts are disposed next to the dot].

9. The bark control device according to claim 8, wherein the transparent pattern comprises an electric shock indicator pattern [used for transmitting light], the through[-]hole comprises a fourth hole [corresponding to a position of] *through which* the electric shock indicator pattern *is exposed*, and the light source component comprises a fourth light emitting body [corresponding] *configured* to [a position of] *emit light through* the fourth hole[; and the electric shock indicator pattern is circular, and a non-transparent slash part and broken line parts are disposed on the electric shock indicator pattern, the broken line parts are arranged on two opposite sides of the slash part].

10. The bark control device according to claim 9, wherein the transparent pattern comprises a [digital] *seven-segment display* pattern [that is used to display] *for displaying* a vibration level [and that is in an "8" shape], the through[-]hole comprises a fifth hole [corresponding to a position of] *through which* the [digital] *seven-segment display* pattern *is exposed*, and the light source [assembly] *component* comprises a fifth light emitting body [corresponding] *configured* to [a position of] *emit light through* the fifth hole.

11. The bark control device according to claim 1, wherein the main body comprises a front case and a bottom case [that is connected to the front case by using ultrasonic waves, the groove and the window are located on the front case, and the display module is fastened to] *, and the window is through* the front case.

12. The bark control device according to claim [1]*5*, wherein the anti-barking assembly comprises a loudspeaker, the loudspeaker [is located at a side] *and the second circuit board being on opposite sides* of the first circuit board [away from the second circuit board, a plurality of sound outlets are disposed on an outer side of the main body at a position corresponding to the loudspeaker, a second wall with a first mounting slot is formed in the main body, the second wall is positioned corresponding to a position of the loudspeaker, and the loudspeaker is fixed in the first mounting slot via glue].

13. The bark control device according to claim [1]*12*, further comprising a microphone [disposed] in the main body and electrically connected to the first circuit board [to pick up sounds], wherein the first circuit board is configured [for driving] *to drive* the anti-barking assembly [to work] according to [an] *a first* electrical signal [fed back by] *from* the microphone.

14. The bark control device according to claim 13, further comprising a vibration detection unit [disposed] in the main body and electrically connected to the first circuit board [to detect vibration], wherein the vibration detection unit is configured [for feeding back an] *to feed a second* electrical signal to the first circuit board when [detecting] *the vibration detection unit detects* vibration, and the first circuit board is configured [for driving] *to drive* the anti-barking assembly [to work] according to the *first* electrical signal [fed back by the vibration detection unit] and the *second* electrical signal [fed back by the microphone].

15. The bark control device according to claim 14, [wherein a function key is disposed on a side of the first circuit board away from the second circuit board, a pressing member is disposed corresponding to a position of the function key of the main body, one end of the pressing member is in contact with the function key, and the other end projects out of the main body, and the pressing member is fastened to the main body on a side adjacent to the window via glue] *further comprising a first switch and a second switch; wherein the first switch is configured to turn the bark control device on and off, and the second switch is configured to control output to the electric shock member, the vibration motor, the loudspeaker, or any combination thereof, from the first circuit board.*

16. The bark control device according to claim 15, wherein the [functional key comprises a] *the* first switch [that] is disposed on the first circuit board [and that is configured to switch on or off, and a second switch that is configured to switch on or off], and the first circuit board is configured for receiving a signal of the second switch [and switch output to the electric shock member or the vibration motor, and/or drive the speaker to work according to the signal].

17. A bark control device, comprising:

a main body, a display module *in the main body*, a lens, an anti-barking assembly, [and]

a first circuit board[, the first circuit board being disposed] in the main body, the first circuit board [being] *is* electrically connected to the anti-barking assembly and the display module [respectively.] , *and* an outer surface of the main body defining a groove, and a window being disposed in the groove, the window being in communication with an interior of the main body;

*wherein* the display module [being disposed in the main body, and being] *is* at least partially disposed in the window, *the display module comprises a second circuit board,* and the lens [being] *is* disposed in the groove and adhered to a bottom surface of the groove by using a waterproof adhesive;

the bark control device further comprising:

a battery electrically connected to the first circuit board, wherein the battery is located between the second circuit board and the first circuit board, a first connector is disposed on a side of the second circuit board near the first circuit board, a second connector is disposed on a side of the first circuit board near the second circuit board, the first connector is connected to the second connector, and the first connector is located beside the battery.

18. The bark control device according to claim 17, wherein the battery is a rechargeable battery, a charging pin electrically connected to the first circuit board is disposed on a side of the main body away from the window, and the charging pin is fixed to the main body via glue or in an injection molding manner; and a magnetic attraction member is disposed on the side of the charging pin of the main body.

* * * * *